(12) United States Patent
Lim et al.

(10) Patent No.: US 12,094,796 B2
(45) Date of Patent: *Sep. 17, 2024

(54) NITROGEN-RICH SILICON NITRIDE FILMS FOR THIN FILM TRANSISTORS

(71) Applicant: Applied Materials, Inc., Santa Clara, CA (US)

(72) Inventors: Rodney S. Lim, Daly City, CA (US); Jung Bae Kim, San Jose, CA (US); Jiarui Wang, San Jose, CA (US); Yi Cui, San Jose, CA (US); Dong Kil Yim, Pleasanton, CA (US); Soo Young Choi, Fremont, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/195,196

(22) Filed: May 9, 2023

(65) Prior Publication Data
US 2023/0274997 A1  Aug. 31, 2023

Related U.S. Application Data

(63) Continuation of application No. 17/338,239, filed on Jun. 3, 2021, now Pat. No. 11,699,628, which is a
(Continued)

(51) Int. Cl.
*H01L 23/31* (2006.01)
*H01L 21/02* (2006.01)
(Continued)

(52) U.S. Cl.
CPC ...... *H01L 23/3192* (2013.01); *H01L 21/0217* (2013.01); *H01L 21/02211* (2013.01);
(Continued)

(58) Field of Classification Search
None
See application file for complete search history.

(56) References Cited

U.S. PATENT DOCUMENTS 7,402,944 B2  7/2008  Jeong et al.
9,515,093 B2  12/2016  Xun et al.
(Continued)

FOREIGN PATENT DOCUMENTS

JP  H05067782 A  3/1993
JP  H1073840 A   3/1998
(Continued)

OTHER PUBLICATIONS

International Search Report and Written Opinion dated Oct. 7, 2020 for Application No. PCT/US2020/038595.
(Continued)

*Primary Examiner* — Asok K Sarkar
(74) *Attorney, Agent, or Firm* — Patterson + Sheridan, LLP

(57) ABSTRACT

Embodiments of the present disclosure generally relate to nitrogen-rich silicon nitride and methods for depositing the same, and transistors and other devices containing the same. In one or more embodiments, a passivation film stack is provided and includes a silicon oxide layer disposed on a workpiece, a nitrogen-rich silicon nitride layer disposed on the silicon oxide layer, and a hydrogen-rich silicon nitride layer disposed on the nitrogen-rich silicon nitride layer. The hydrogen-rich silicon nitride layer has a greater hydrogen concentration than the nitrogen-rich silicon nitride layer.

20 Claims, 5 Drawing Sheets

Related U.S. Application Data continuation of application No. 16/557,102, filed on Aug. 30, 2019, now Pat. No. 11,037,851.

(51) Int. Cl.
 *H01L 27/12* (2006.01)
 *H01L 29/786* (2006.01)

(52) U.S. Cl.
 CPC .... *H01L 21/02274* (2013.01); *H01L 27/1248* (2013.01); *H01L 29/786* (2013.01)

(56) References Cited

U.S. PATENT DOCUMENTS

| | | | |
|---|---|---|---|
| 9,741,557 | B1 | 8/2017 | Dellas et al. |
| 10,032,803 | B2 | 7/2018 | Xun et al. |
| 11,037,851 | B2 | 6/2021 | Lim et al. |
| 11,699,628 | B2 * | 7/2023 | Lim .................... H01L 27/1248 257/66 |
| 2005/0269946 | A1 | 12/2005 | Jeong et al. |
| 2006/0111244 | A1 | 5/2006 | Gan et al. |
| 2007/0207624 | A1 | 9/2007 | Chua |
| 2009/0035927 | A1 | 2/2009 | Olsen et al. |
| 2010/0102376 | A1 | 4/2010 | Ma et al. |
| 2010/0269896 | A1 | 10/2010 | Sheng et al. |
| 2013/0087783 | A1 | 4/2013 | Wang et al. |
| 2015/0200212 | A1 | 7/2015 | Xun et al. |
| 2016/0126494 | A1 | 5/2016 | Jung et al. |
| 2016/0240389 | A1 | 8/2016 | Zhang et al. |
| 2017/0053940 | A1 | 2/2017 | Xun et al. |
| 2019/0252239 | A1 | 8/2019 | Pal et al. |
| 2021/0066153 | A1 | 3/2021 | Lim et al. |
| 2021/0287955 | A1 | 9/2021 | Lim et al. |

FOREIGN PATENT DOCUMENTS

| | | |
|---|---|---|
| JP | 2002134504 A | 5/2002 |
| JP | 2004327844 A | 11/2004 |
| JP | 2005067782 A | 3/2005 |
| JP | 2007042467 A | 2/2007 |
| JP | 2015012131 A | 1/2015 |
| JP | 2016048792 A | 4/2016 |
| WO | 2017223541 A1 | 12/2017 |

OTHER PUBLICATIONS

Japanese Office Action dated Apr. 25, 2023 for Application No. 2022-511228.
Korean Office Action dated Jul. 14, 2023 for Application No. 10-2022-7009935.
Taiwan Office Action dated Nov. 2, 2023 for Application No. 109122340.
Korean Office Action dated Jan. 17, 2024 for Application No. 10-2023-7043529.

\* cited by examiner

NITROGEN-RICH SILICON NITRIDE FILMS FOR THIN FILM TRANSISTORS

CROSS-REFERENCE TO RELATED APPLICATIONS

This application is a continuation of U.S. patent application Ser. No. 17/338,239, filed Jun. 3, 2021, which is a continuation of U.S. patent application Ser. No. 16/557,102, filed Aug. 30, 2019, which are herein incorporated by reference.

BACKGROUND

Field

Embodiments of the present disclosure generally relate to deposition processes, and in particular to vapor deposition processes for depositing silicon nitride and other materials on workpieces.

Description of the Related Art

Liquid crystal displays (LCDs), organic light emitting diodes (OLEDs), and micro-LED panels are frequently used for flat panel displays. Typically, LCDs generally contain two glass substrates joined together with a layer of a liquid crystal material sandwiched therebetween. The glass substrate may be a semiconductor substrate, or may be a transparent substrate such as glass, quartz, sapphire, or a clear plastic film. The LCD may also contain light emitting diodes for back lighting.

As the resolution requirements for LCDs increase, it has become desirable to control a large number of separate areas of the liquid crystal cell, called pixels. Modern display panels can have about 8 million pixels (4K resolution), about 33 million pixels (8K resolution), or more. At least the same number of transistors is formed on the glass substrate so that each pixel can be switched between an energized and de-energized state relative to the other pixels disposed on the substrate.

Silicon containing materials have become the building block for most TFTs. Silicon containing materials have been used to form the channel material, such as polysilicon for a low temperature polysilicon (LTPS) TFT and as a component utilized in forming a gate dielectric layer, interface layer, passivation layer, and/or even an etch stop layer in a TFT.

For metal oxide channel based TFTs, silicon containing passivation layers cannot protect devices, especially for In—Ga—Zn oxide (IGZO) channel semiconductor, against humidity and gas diffusion. The diffusion of humidity ($H_2O$) and/or gases (e.g., $H_2$, $O_2$, and/or $N_2$) into the IGZO channel semiconductor, as well as other layers, destabilizes the overall device. Typically, moisture and gases can be generated by various underlying layers and diffuse through or from the passivation layers containing hydrogen-rich silicon oxide and/or hydrogen-rich silicon nitride.

Therefore, there is a need for passivation materials to reduce or eliminate the diffusion of humidity and/or gases within a TFT or other types of devices.

SUMMARY

Embodiments of the present disclosure generally relate to nitrogen-rich silicon nitride and methods for depositing the same, and transistors and other devices containing the same.

In one or more embodiments, a passivation film stack contains a silicon oxide layer disposed on a workpiece and a nitrogen-rich silicon nitride layer disposed on the silicon oxide layer. The nitrogen-rich silicon nitride layer has a silicon concentration of about 20 at % to about 35 at %, a nitrogen concentration of about 40 at % to about 75 at %, and a hydrogen concentration of about 10 at % to about 35 at %. In one or more examples, the passivation film stack contains the silicon oxide layer, the nitrogen-rich silicon nitride layer, and a third layer containing any type of silicon nitride, such as nitrogen-rich silicon nitride and/or hydrogen-rich silicon nitride.

In other embodiments, a passivation film stack contains a silicon oxide layer disposed on a workpiece and a nitrogen-rich silicon nitride layer disposed on the silicon oxide layer, where the nitrogen-rich silicon nitride layer has a water resistivity of about $1\times10^{-8}$ g/m$^2$/day to about $1\times10^{-4}$ g/m$^2$/day and a silicon-hydrogen bond concentration of about 0.1% to about 10%, and where the nitrogen-rich silicon nitride layer has a nitrogen to silicon ratio of greater than 1.03 to about 2. In some examples, the nitrogen-rich silicon nitride layer has a silicon-hydrogen bond concentration of about 0.5% to about 6% and a total hydrogen bond concentration (including nitrogen-hydrogen bond concentration) of less than 30%.

In some embodiments, a method for depositing a silicon nitride material includes heating a workpiece to a temperature of about 200° C. to about 250° C., exposing the workpiece to a deposition gas during a plasma-enhanced chemical vapor deposition (PE-CVD) process, and depositing a nitrogen-rich silicon nitride layer on the workpiece. The deposition gas contains a silicon precursor, a nitrogen precursor, and a carrier gas, and where the deposition gas has a molar ratio of the silicon precursor to the nitrogen precursor to the carrier gas within the deposition gas is about 1: a range from about 4 to about 8: a range from about 20 to about 80, respectively. In some examples, the deposition gas has a molar ratio of the silicon precursor to the nitrogen precursor to the carrier gas within the deposition gas is about 1: a range from about 5 to about 7: a range from about 30 to about 50, respectively. In one or more examples, the silicon precursor is or contains silane, the nitrogen precursor is or contains ammonia, and the carrier gas is or contains nitrogen ($N_2$).

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, may admit to other equally effective embodiments.

To facilitate understanding, identical reference numerals have been used, where possible, to designate identical elements that are common to the Figures. It is contemplated that elements and features of one or more embodiments may be beneficially incorporated in other embodiments.

DETAILED DESCRIPTION

Figure 1:
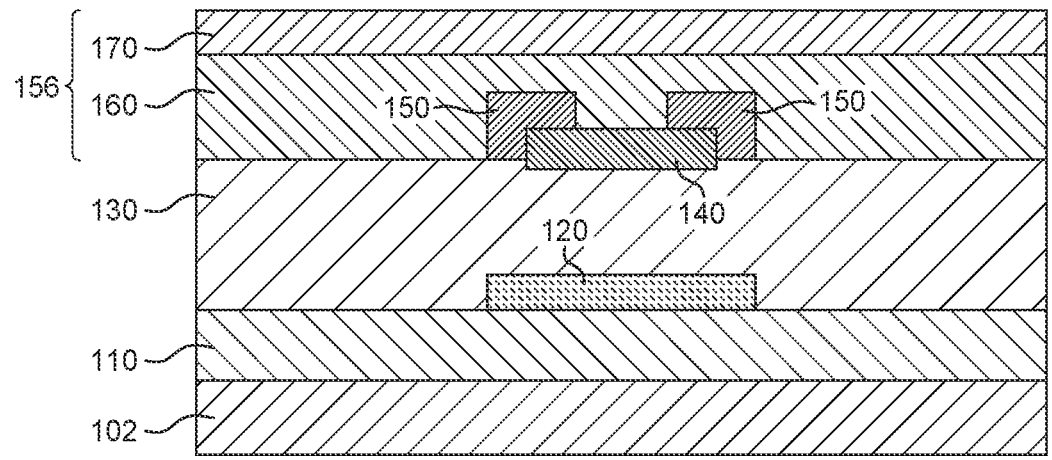
FIG. 1 is a schematic view of a thin film transistor (TFT) structure containing a nitrogen-rich silicon nitride layer, according to one or more embodiments described and discussed herein.

Embodiments of the present disclosure generally relate to passivation film stack containing nitrogen-rich silicon nitride, methods for depositing the passivation film stack, and transistors and other devices containing the passivation film stack. In one or more embodiments, a passivation film stack contains a silicon oxide layer disposed on a workpiece and a nitrogen-rich silicon nitride layer disposed on the silicon oxide layer. In some examples, the passivation film stack is disposed on the workpiece and contains the silicon oxide layer, the nitrogen-rich silicon nitride layer, and a third layer containing any type of silicon nitride, such as nitrogen-rich silicon nitride and/or hydrogen-rich silicon nitride.

The nitrogen-rich silicon nitride layer contains more nitrogen and/or less hydrogen than traditional silicon nitride. The traditional silicon nitrides are typically nitrogen-poor silicon nitride and/or hydrogen-rich silicon nitride. As such, the hydrogen-rich silicon nitride layer has a greater hydrogen concentration than the nitrogen-rich silicon nitride layer described and discussed herein. Also, the nitrogen-rich silicon nitride layer has a greater water resistivity than the nitrogen-poor silicon nitride and/or the hydrogen-rich silicon nitride.

In one or more embodiments, the nitrogen-rich silicon nitride layer has a silicon concentration of about 20 atomic percentage (at %), about 22 at %, about 24 at %, about 25 at %, about 26 at %, about 27 at %, about 28 at %, about 29 at %, about 30 at %, or about 31 at % to about 32 at %, about 33 at %, about 34 at %, about 35 at %, about 36 at %, about 37 at %, about 38 at %, or greater. For example, the nitrogen-rich silicon nitride layer has a silicon concentration of about 20 at % to about 38 at %, about 22 at % to about 38 at %, about 25 at % to about 38 at %, about 27 at % to about 38 at %, about 28 at % to about 38 at %, about 30 at % to about 38 at %, about 31 at % to about 38 at %, about 32 at % to about 38 at %, about 33 at % to about 38 at %, about 35 at % to about 38 at %, about 36 at % to about 38 at %, about 20 at % to about 35 at %, about 22 at % to about 35 at %, about 25 at % to about 35 at %, about 27 at % to about 35 at %, about 28 at % to about 35 at %, about 30 at % to about 35 at %, about 31 at % to about 35 at %, about 32 at % to about 35 at %, about 33 at % to about 35 at %, about 20 at % to about 34 at %, about 22 at % to about 34 at %, about 25 at % to about 34 at %, about 27 at % to about 34 at %, about 28 at % to about 34 at %, about 30 at % to about 34 at %, about 31 at % to about 34 at %, about 32 at % to about 34 at %, about 33 at % to about 34 at %, about 20 at % to about 33 at %, about 22 at % to about 33 at %, about 25 at % to about 33 at %, about 27 at % to about 33 at %, about 28 at % to about 33 at %, about 30 at % to about 33 at %, about 31 at % to about 33 at %, or about 32 at % to about 33 at %.

In some embodiments, the nitrogen-rich silicon nitride layer has a nitrogen concentration of about 40 at %, about 42 at %, about 43 at %, about 44 at %, about 45 at %, about 46 at %, about 48 at %, about 50 at %, or about 52 at % to about 54 at %, about 55 at %, about 58 at %, about 60 at %, about 65 at %, about 70 at %, about 72 at %, about 75 at %, or greater. For example, the nitrogen-rich silicon nitride layer has a nitrogen concentration of about 40 at % to about 75 at %, about 42 at % to about 75 at %, about 43 at % to about 75 at %, about 44 at % to about 75 at %, about 45 at % to about 75 at %, about 48 at % to about 75 at %, about 50 at % to about 75 at %, about 55 at % to about 75 at %, about 60 at % to about 75 at %, about 65 at % to about 75 at %, about 70 at % to about 75 at %, about 40 at % to about 65 at %, about 42 at % to about 65 at %, about 43 at % to about 65 at %, about 44 at % to about 65 at %, about 45 at % to about 65 at %, about 48 at % to about 65 at %, about 50 at % to about 65 at %, about 55 at % to about 65 at %, about 60 at % to about 65 at %, about 62 at % to about 65 at %, about 40 at % to about 58 at %, about 42 at % to about 58 at %, about 43 at % to about 58 at %, about 44 at % to about 58 at %, about 45 at % to about 58 at %, about 48 at % to about 58 at %, about 50 at % to about 58 at %, about 55 at % to about 58 at %, about 40 at % to about 55 at %, about 42 at % to about 55 at %, about 43 at % to about 55 at %, about 44 at % to about 55 at %, about 45 at % to about 55 at %, about 48 at % to about 55 at %, about 50 at % to about 55 at %, or about 52 at % to about 55 at %.

In one or more embodiments, the nitrogen-rich silicon nitride layer has a hydrogen concentration of about 10 at %, about 12 at %, about 15 at %, about 18 at %, or about 20 at % to about 21 at %, about 22 at %, about 23 at %, about 25 at %, about 27 at %, about 30 at %, about 32 at %, about 35 at %, or greater. For example, the nitrogen-rich silicon nitride layer has a hydrogen concentration of about 10 at % to about 35 at %, about 12 at % to about 35 at %, about 15 at % to about 35 at %, about 18 at % to about 35 at %, about 19 at % to about 35 at %, about 20 at % to about 35 at %, about 21 at % to about 35 at %, about 22 at % to about 35 at %, about 23 at % to about 35 at %, about 24 at % to about 35 at %, about 25 at % to about 35 at %, about 28 at % to about 35 at %, about 30 at % to about 35 at %, about 10 at % to about 25 at %, about 12 at % to about 25 at %, about 15 at % to about 25 at %, about 18 at % to about 25 at %, about 19 at % to about 25 at %, about 20 at % to about 25 at %, about 21 at % to about 25 at %, about 22 at % to about 25 at %, about 23 at % to about 25 at %, about 24 at % to about 25 at %, about 10 at % to about 23 at %, about 12 at % to about 23 at %, about 15 at % to about 23 at %, about 18 at % to about 23 at %, about 19 at % to about 23 at %, about 20 at % to about 23 at %, about 21 at % to about 23 at %, or about 22 at % to about 23 at %.

In one or more examples, the nitrogen-rich silicon nitride layer has a silicon concentration of about 20 at % to about 35 at %, a nitrogen concentration of about 40 at % to about 75 at %, and a hydrogen concentration of about 10 at % to about 35 at %. In other examples, the nitrogen-rich silicon nitride layer has a silicon concentration of about 27 at % to about 34 at %, a nitrogen concentration of about 42 at % to about 65 at %, and a hydrogen concentration of about 18 at % to about 25 at %. In some examples, the nitrogen-rich silicon nitride layer has a silicon concentration of about 28 at % to about 33 at %, a nitrogen concentration of about 43 at % to about 58 at %, and a hydrogen concentration of about 19 at % to about 23 at %.

In one or more embodiments, the nitrogen-rich silicon nitride layer has a nitrogen to silicon ratio of greater than 1, greater than 1.02, greater than 1.03, or greater than 1.05, such as about 1.06, about 1.08, about 1.10, about 1.12, about 1.15, about 1.18, about 1.20, about 1.22, or about 1.25 to about 1.28, about 1.30, about 1.35, about 1.38, about 1.40, about 1.45, about 1.50, about 1.55, about 1.60, about 1.80, about 1.90, about 2, or higher. For example, the nitrogen-rich silicon nitride layer has a nitrogen to silicon ratio of greater than 1.03 to about 2, greater than 1.03 to about 1.9, greater than 1.03 to about 1.8, greater than 1.03 to about 1.7, greater than 1.03 to about 1.6, greater than 1.03 to about 1.5, greater than 1.03 to about 1.45, greater than 1.03 to about 1.4, greater than 1.03 to about 1.39, greater than 1.03 to about 1.38, greater than 1.03 to about 1.36, greater than 1.03 to about 1.35, greater than 1.03 to about 1.3, greater than 1.03 to about 1.25, greater than 1.03 to about 1.2, greater than 1.03 to about 1.15, greater than 1.03 to about 1.1, about 1.05 to about 2, about 1.05 to about 1.9, about 1.05 to about 1.8, about 1.05 to about 1.7, about 1.05 to about 1.6, about 1.05 to about 1.5, about 1.05 to about 1.45, about 1.05 to about 1.4, about 1.05 to about 1.39, about 1.05 to about 1.38, about 1.05 to about 1.36, about 1.05 to about 1.35, about 1.05 to about 1.3, about 1.05 to about 1.25, about 1.05 to about 1.2, about 1.05 to about 1.15, about 1.05 to about 1.1, about 1.1 to about 2, about 1.1 to about 1.9, about 1.1 to about 1.8, about 1.1 to about 1.7, about 1.1 to about 1.6, about 1.1 to about 1.5, about 1.1 to about 1.45, about 1.1 to about 1.4, about 1.1 to about 1.39, about 1.1 to about 1.38, about 1.1 to about 1.36, about 1.1 to about 1.35, about 1.1 to about 1.3, about 1.1 to about 1.25, about 1.1 to about 1.2, about 1.1 to about 1.15, about 1.2 to about 2, about 1.2 to about 1.9, about 1.2 to about 1.8, about 1.2 to about 1.7, about 1.2 to about 1.6, about 1.2 to about 1.5, about 1.2 to about 1.45, about 1.2 to about 1.4, about 1.2 to about 1.39, about 1.2 to about 1.38, about 1.2 to about 1.36, about 1.2 to about 1.35, about 1.2 to about 1.3, or about 1.2 to about 1.25.

In some embodiments, the nitrogen-rich silicon nitride layer has a silicon-hydrogen bond concentration of about 0.05%, about 0.1%, about 0.2%, about 0.5%, about 0.8%, about 1%, about 1.2%, about 1.5%, about 1.8%, or about 2% to about 2.2%, about 2.5%, about 2.8%, about 3%, about 3.5%, about 4%, about 5%, about 6%, about 8%, about 10%, about 12%, about 14%, about 15%, about 16%, about 17%, or less than 18%, as determined by Fourier-transform infrared (FT-IR) spectroscopy measurements. For example, the nitrogen-rich silicon nitride layer has a silicon-hydrogen bond concentration of about 0.1% to less than 18%, about 0.1% to about 17%, about 0.1% to about 15%, about 0.1% to about 12%, about 0.1% to about 10%, about 0.1% to about 8%, about 0.1% to about 6%, about 0.1% to about 5%, about 0.1% to about 4%, about 0.1% to about 3%, about 0.1% to about 2%, about 0.1% to about 1%, about 0.5% to less than 18%, about 0.5% to about 17%, about 0.5% to about 15%, about 0.5% to about 12%, about 0.5% to about 10%, about 0.5% to about 8%, about 0.5% to about 6%, about 0.5% to about 5%, about 0.5% to about 4%, about 0.5% to about 3%, about 0.5% to about 2%, about 0.5% to about 1%, about 1% to less than 18%, about 1% to about 17%, about 1% to about 15%, about 1% to about 12%, about 1% to about 10%, about 1% to about 8%, about 1% to about 6%, about 1% to about 5%, about 1% to about 4%, about 1% to about 3%, about 1% to about 2%, or about 1% to about 1.5%, as determined by FT-IR spectroscopy measurements.

In one or more embodiments, the nitrogen-rich silicon nitride layer has a nitrogen-hydrogen bond concentration of about 1%, about 3%, about 5%, about 6%, about 8%, about 10%, about 12%, about 15%, or about 18% to about 20%, about 22%, about 25%, about 26%, about 27%, about 28%, about 28%, or about 30%, as determined by FT-IR spectroscopy measurements. For example, the nitrogen-rich silicon nitride layer has a nitrogen-hydrogen bond concentration of about 1% to about 30%, about 3% to about 30%, about 5% to about 30%, about 8% to about 30%, about 10% to about 30%, about 12% to about 30%, about 15% to about 30%, about 18% to about 30%, about 20% to about 30%, about 25% to about 30%, about 1% to about 25%, about 3% to about 25%, about 5% to about 25%, about 8% to about 25%, about 10% to about 25%, about 12% to about 25%, about 15% to about 25%, about 18% to about 25%, about 20% to about 25%, about 1% to about 22%, about 3% to about 22%, about 5% to about 22%, about 8% to about 22%, about 10% to about 22%, about 12% to about 22%, about 15% to about 22%, about 18% to about 22%, or about 20% to about 22%, as determined by FT-IR spectroscopy measurements.

A total-hydrogen bond concentration of the nitrogen-rich silicon nitride layer is the sum of the silicon-hydrogen bond concentration and the nitrogen-hydrogen bond concentration. In one or more embodiments, the nitrogen-rich silicon nitride layer has a total-hydrogen bond concentration of less than 30%, such as about 1%, about 2%, about 3%, about 5%, about 6%, about 8%, about 10%, about 12%, about 15%, about 16%, or about 18% to about 20%, about 22%, about 23%, about 24%, about 25%, about 26%, about 27%, about 28%, about 28%, about 29%, or less than 30%, as determined by FT-IR spectroscopy measurements. For example, the nitrogen-rich silicon nitride layer has a nitrogen-hydrogen bond concentration of about 1% to less than 30%, about 3% to less than 30%, about 5% to less than 30%, about 8% to less than 30%, about 10% to less than 30%, about 12% to less than 30%, about 15% to less than 30%, about 18% to less than 30%, about 20% to less than 30%, about 25% to less than 30%, about 1% to about 28%, about 3% to about 28%, about 5% to about 28%, about 8% to about 28%, about 10% to about 28%, about 12% to about 28%, about 15% to about 28%, about 18% to about 28%, about 20% to about 28%, about 1% to about 24%, about 3% to about 24%, about 5% to about 24%, about 8% to about 24%, about 10% to about 24%, about 12% to about 24%, about 15% to about 24%, about 18% to about 24%, about 20% to about 24%, about 1% to about 23%, about 3% to about 23%, about 5% to about 23%, about 8% to about 23%, about 10% to about 23%, about 12% to about 23%, about 15% to about 23%, about 16% to about 23%, about 18% to about 23%, or about 20% to about 23%, as determined by FT-IR spectroscopy measurements.

The nitrogen-rich silicon nitride layer has a relatively high water resistivity when compared to traditional silicon nitrides. In one or more embodiments, the nitrogen-rich silicon nitride layer has a water resistivity of about $1 \times 10^{-8}$ g/m²/day or greater, such as about $2 \times 10^{-8}$ g/m²/day, about $5 \times 10^{-8}$ g/m²/day, about $1 \times 10^{-7}$ g/m²/day, about $5 \times 10^{-7}$ g/m²/day, about $1 \times 10^{-6}$ g/m²/day, or about $5 \times 10^{-6}$ g/m²/day to about $1 \times 10^{-5}$ g/m²/day, about $5 \times 10^{-5}$ g/m²/day, about $1 \times 10^{-4}$ g/m²/day, about $5 \times 10^{-4}$ g/m²/day, or about $1 \times 10^{-3}$ g/m²/day, according to the Water Vapor Transmission Rate (WVTR) standard test, conducted at 85% relative humidity and at 85° C. For example, the nitrogen-rich silicon nitride layer has a water resistivity of about $1\times10^{-8}$ g/m²/day to about $1\times10^{-4}$ g/m²/day, about $1\times10^{-7}$ g/m²/day to about $5\times10^{-4}$ g/m²/day, or about $5\times10^{-6}$ g/m²/day to about $1\times10^{-5}$ g/m²/day, according to the WVTR standard test, conducted at 85% relative humidity and at 85° C. In one or more examples, a nitrogen-rich silicon nitride layer with a thickness of about 2,000 Å has a water resistivity of about $2.8\times10^{-4}$ g/m²/day to about $4\times10^{-4}$ g/m²/day, according to the WVTR standard test, conducted at 100% relative humidity and at 40° C.

In one or more embodiments, methods for depositing the nitrogen-rich silicon nitride material or layer include heating a workpiece to a process temperature, exposing the workpiece to a deposition gas during a plasma-enhanced chemical vapor deposition (PE-CVD) process, and depositing the nitrogen-rich silicon nitride material or layer on the workpiece. In other embodiments, methods for depositing the nitrogen-rich silicon nitride material or layer include heating the workpiece to a process temperature, sequentially exposing the workpiece to a silicon precursor and a nitrogen precursor during a thermal atomic layer deposition (ALD) process or a plasma-enhanced ALD (PE-ALD) process, and depositing the nitrogen-rich silicon nitride material or layer on the workpiece. In embodiments described and discussed herein, the workpiece can be or include a substrate, a thin film transistor (TFT) structure or portions thereof, a gate structure or portions thereof, or any other type of electronic device or portions thereof related to display, semiconductor, photovoltaic, microelectronics, and/or other fields. In some examples, the workpiece includes one or more layers containing silicon oxide. In one or more examples, the method includes depositing a silicon oxide layer on the workpiece and then depositing a nitrogen-rich silicon nitride layer on the silicon oxide layer.

During the PE-CVD or other deposition process, the substrate or workpiece can be heated to or maintained at the process temperature. The process temperature can be about 25° C., about 50° C., about 80° C., about 100° C., about 150° C., or about 200° C. to about 220° C., about 235° C., about 250° C., about 280° C., about 300° C., about 350° C., about 400° C., or greater. For example, the process temperature can be from about 25° C. to about 400° C., about 25° C. to about 300° C., about 25° C. to about 280° C., about 25° C. to about 265° C., about 25° C. to about 250° C., about 25° C. to about 235° C., about 25° C. to about 220° C., about 25° C. to about 200° C., about 25° C. to about 180° C., about 25° C. to about 150° C., about 25° C. to about 125° C., about 25° C. to about 100° C., about 25° C. to about 80° C., about 25° C. to about 50° C., about 100° C. to about 400° C., about 100° C. to about 300° C., about 100° C. to about 280° C., about 100° C. to about 265° C., about 100° C. to about 250° C., about 100° C. to about 235° C., about 100° C. to about 220° C., about 100° C. to about 200° C., about 100° C. to about 180° C., about 100° C. to about 150° C., about 100° C. to about 125° C., about 200° C. to about 400° C., about 200° C. to about 300° C., about 200° C. to about 280° C., about 200° C. to about 265° C., about 200° C. to about 250° C., about 200° C. to about 235° C., about 200° C. to about 220° C., about 220° C. to about 250° C., about 230° C. to about 250° C., or about 235° C. to about 250° C. In one or more examples, the process temperature is less than 350° C., less than 300° C., less than 280° C., less than 265° C., less than 250° C., less than 235° C., or less than 200° C.

In one or more embodiments, during the PE-CVD or other deposition process, the deposition gas can include one or more silicon precursors, one or more nitrogen precursors, and one or more carrier gases. The silicon precursor can be or include one or more of silane, disilane, trisilane, tetrasilane, silicon tetrafluoride, or any combination thereof. The nitrogen precursor can be or include one or more of ammonia, hydrazine, methylamine, dimethylamine, nitrogen ($N_2$), plasmas thereof, or any combination thereof. The carrier gas can be or include one or more of nitrogen ($N_2$), hydrogen ($H_2$), argon, helium, neon, xenon, krypton, or any combination thereof. In one or more examples, the silicon precursor is or contains silane, the nitrogen precursor is or contains ammonia, and the carrier gas is or contains nitrogen ($N_2$).

The flow rate of the silicon precursor in the deposition gas can be about 100 sccm (standard cubic centimeters per minute), about 150 sccm, about 180 sccm, about 200 sccm, about 220 sccm, or about 250 sccm to about 280 sccm, about 300 sccm, about 320 sccm, about 350 sccm, about 400 sccm, about 450 sccm, about 500 sccm, about 650 sccm, about 800 sccm, or about 1,000 sccm. For example, the flow rate of the silicon precursor can be from about 100 sccm to about 1,000 sccm, about 100 sccm to about 800 sccm, about 100 sccm to about 500 sccm, about 100 sccm to about 400 sccm, about 100 sccm to about 350 sccm, about 100 sccm to about 300 sccm, about 100 sccm to about 250 sccm, about 100 sccm to about 200 sccm, about 200 sccm to about 1,000 sccm, about 200 sccm to about 800 sccm, about 200 sccm to about 500 sccm, about 200 sccm to about 400 sccm, about 200 sccm to about 350 sccm, about 200 sccm to about 300 sccm, about 200 sccm to about 250 sccm, about 200 sccm to about 225 sccm, about 250 sccm to about 1,000 sccm, about 250 sccm to about 800 sccm, about 250 sccm to about 500 sccm, about 250 sccm to about 400 sccm, about 250 sccm to about 350 sccm, about 250 sccm to about 300 sccm, about 250 sccm to about 280 sccm, about 270 sccm to about 300 sccm, about 285 sccm to about 300 sccm, about 270 sccm to about 320 sccm, or about 285 sccm to about 320 sccm.

The flow rate of the nitrogen precursor in the deposition gas can be about 800 sccm, about 1,000 sccm, about 1,200 sccm, about 1,350 sccm, about 1,500 sccm, or about 1,600 sccm to about 1,650 sccm, about 1,700 sccm, about 1,800 sccm, about 2,000 sccm, about 2,200 sccm, about 2,500 sccm, about 3,000 sccm, about 3,500 sccm, about 4,000 sccm, or about 5,000 sccm. For example, the flow rate of the nitrogen precursor can be from about 1,000 sccm to about 5,000 sccm, about 1,000 sccm to about 4,000 sccm, about 1,000 sccm to about 3,000 sccm, about 1,000 sccm to about 2,500 sccm, about 1,000 sccm to about 2,000 sccm, about 1,000 sccm to about 1,800 sccm, about 1,000 sccm to about 1,500 sccm, about 1,500 sccm to about 5,000 sccm, about 1,500 sccm to about 4,000 sccm, about 1,500 sccm to about 3,000 sccm, about 1,500 sccm to about 2,500 sccm, about 1,500 sccm to about 2,000 sccm, about 1,500 sccm to about 1,800 sccm, about 1,800 sccm to about 5,000 sccm, about 1,800 sccm to about 4,000 sccm, about 1,800 sccm to about 3,000 sccm, about 1,800 sccm to about 2,500 sccm, or about 1,800 sccm to about 2,000 sccm.

The flow rate of the carrier gas in the deposition gas can be about 1 SLM (standard liters per minute), about 3 SLM, about 4 SLM, about 5 SLM, about 6 SLM, or about 8 SLM to about 9 SLM, about 10 SLM, about 12 SLM, about 15 SLM, about 18 SLM, about 20 SLM, about 22 SLM, about 25 SLM, or about 30 SLM. For example, the flow rate of the carrier gas can be from about 1 SLM to about 30 SLM, about 5 SLM to about 30 SLM, about 8 SLM to about 30 SLM, about 10 SLM to about 30 SLM, about 12 SLM to about 30 SLM, about 15 SLM to about 30 SLM, about 20 SLM to about 30 SLM, about 1 SLM to about 20 SLM, about 5 SLM to about 20 SLM, about 8 SLM to about 20 SLM, about 10

SLM to about 20 SLM, about 12 SLM to about 20 SLM, about 15 SLM to about 20 SLM, about 18 SLM to about 20 SLM, about 1 SLM to about 15 SLM, about 5 SLM to about 15 SLM, about 8 SLM to about 15 SLM, about 10 SLM to about 15 SLM, about 12 SLM to about 15 SLM, or about 13 SLM to about 15 SLM.

In one or more examples, the deposition gas has a molar ratio of the silicon precursor to the nitrogen precursor to the carrier gas of about 1 (of the silicon precursor): a range from about 4 to about 8 (of the nitrogen precursor): a range from about 20 to about 80 (of the carrier gas), respectively. In other examples, the deposition gas has a molar ratio of the silicon precursor to the nitrogen precursor to the carrier gas of about 1 (of the silicon precursor): a range from about 5 to about 7 (of the nitrogen precursor): a range from about 30 to about 50 (of the carrier gas), respectively. In some examples, the deposition gas has a molar ratio of the silicon precursor to the nitrogen precursor to the carrier gas of about 1 (of the silicon precursor): a range from about 5.5 to about 6.5 (of the nitrogen precursor): a range from about 35 to about 45 (of the carrier gas), respectively.

The PE-CVD or other deposition process can be performed on a variety of plasma systems, such as a capacitive coupling plasma (CCP) system, an inductive coupling plasma (ICP) system with high density plasma (HDP), or a remote plasma system (RPS), or other PE-CVD or PE-ALD process chambers or systems. During the PE-CVD or other deposition process, the plasma can have an RF power of less than 2,400 W, such as about 800 W, about 1,000 W, about 1,200 W, about 1,500 W, about 1,700 W, or about 1,800 W to about 1,900 W, about 2,000 W, about 2,100 W, about 2,200 W, or about 2,300 W. For example, the plasma can have an RF power of about 800 W to less than 2,400 W, about 800 W to about 2,200 W, about 800 W to about 2,000 W, about 800 W to about 1,900 W, about 800 W to about 1,800 W, about 800 W to about 1,600 W, about 800 W to about 1,200 W, about 1,200 W to less than 2,400 W, about 1,200 W to about 2,200 W, about 1,200 W to about 2,000 W, about 1,200 W to about 1,900 W, about 1,200 W to about 1,800 W, about 1,200 W to about 1,600 W, about 1,200 W to about 1,500 W, about 1,500 W to less than 2,400 W, about 1,500 W to about 2,200 W, about 1,500 W to about 2,000 W, about 1,500 W to about 1,900 W, or about 1,500 W to about 1,800 W.

In one or more embodiments, the nitrogen-rich silicon nitride layer is a portion of a passivation film stack that includes a silicon oxide layer and the nitrogen-rich silicon nitride layer disposed on the silicon oxide layer. In some example, the passivation film stack also includes a third layer containing silicon nitride disposed on the nitrogen-rich silicon nitride layer. The third layer can be or include any type of silicon nitride, such as nitrogen-rich silicon nitride, nitrogen-poor silicon nitride, and/or hydrogen-rich silicon nitride. In other embodiments, the nitrogen-rich silicon nitride layer is a portion of a oxide buffer film stack that includes an oxide buffer layer containing nitrogen-rich silicon nitride disposed on an oxide buffer layer containing silicon oxide.

In some embodiments, the silicon oxide layer and/or the oxide buffer layer containing silicon oxide can be deposited or otherwise formed during a PE-CVD process. The PE-CVD process includes exposing the workpiece to an oxide deposition gas and depositing the silicon oxide layer and/or the oxide buffer layer containing silicon oxide on the workpiece. The oxide deposition gas can include one or more silicon precursors, one or more oxidizing agents, and optionally, one or more carrier gases. The silicon precursor can be or include one or more of silane, disilane, trisilane, tetrasilane, silicon tetrafluoride, or any combination thereof. The oxidizing agent can be or include one or more of nitrous oxide, oxygen, ozone, water, one or more peroxides, plasmas thereof, or any combination thereof. The carrier gas, if included, can be or include one or more of nitrogen ($N_2$), hydrogen ($H_2$), argon, helium, neon, krypton, or any combination thereof. In one or more examples, the silicon precursor is or contains silane and the oxidizing agent is or contains nitrous oxide.

The flow rate of the silicon precursor in the oxide deposition gas can be about 20 sccm, about 35 sccm, about 50 sccm, about 60 sccm, about 80 sccm, or about 100 sccm, to about 120 sccm, about 135 sccm, about 150 sccm, about 165 sccm, about 180 sccm, about 200 sccm, about 250 sccm, about 280 sccm, about 300 sccm, about 350 sccm, about 400 sccm, or about 500 sccm. For example, the flow rate of the silicon precursor can be from about 20 sccm to about 500 sccm, about 20 sccm to about 400 sccm, about 20 sccm to about 350 sccm, about 20 sccm to about 300 sccm, about 20 sccm to about 250 sccm, about 20 sccm to about 220 sccm, about 20 sccm to about 200 sccm, about 20 sccm to about 180 sccm, about 20 sccm to about 165 sccm, about 20 sccm to about 150 sccm, about 20 sccm to about 135 sccm, about 20 sccm to about 120 sccm, about 20 sccm to about 100 sccm, about 20 sccm to about 80 sccm, about 20 sccm to about 50 sccm, about 100 sccm to about 500 sccm, about 100 sccm to about 400 sccm, about 100 sccm to about 350 sccm, about 100 sccm to about 300 sccm, about 100 sccm to about 250 sccm, about 100 sccm to about 220 sccm, about 100 sccm to about 200 sccm, about 100 sccm to about 180 sccm, about 100 sccm to about 165 sccm, about 100 sccm to about 150 sccm, about 100 sccm to about 135 sccm, about 100 sccm to about 120 sccm, about 140 sccm to about 500 sccm, about 140 sccm to about 400 sccm, about 140 sccm to about 350 sccm, about 140 sccm to about 300 sccm, about 140 sccm to about 250 sccm, about 140 sccm to about 220 sccm, about 140 sccm to about 200 sccm, about 140 sccm to about 180 sccm, about 140 sccm to about 165 sccm, or about 140 sccm to about 150 sccm.

The flow rate of the oxidizing agent in the oxide deposition gas can be about 1 SLM, about 2 SLM, about 3 SLM, about 4 SLM, about 5 SLM, or about 6 SLM to about 7 SLM, about 8 SLM, about 9 SLM, about 10 SLM, about 11 SLM, about 12 SLM, about 14 SLM, about 16 SLM, about 18 SLM, or about 20 SLM. For example, the flow rate of the oxidizing agent in the oxide deposition gas can be from about 1 SLM to about 20 SLM, about 1 SLM to about 18 SLM, about 1 SLM to about 15 SLM, about 1 SLM to about 12 SLM, about 1 SLM to about 10 SLM, about 1 SLM to about 8 SLM, about 1 SLM to about 6 SLM, about 1 SLM to about 5 SLM, about 4 SLM to about 20 SLM, about 4 SLM to about 18 SLM, about 4 SLM to about 15 SLM, about 4 SLM to about 12 SLM, about 4 SLM to about 10 SLM, about 4 SLM to about 8 SLM, about 4 SLM to about 6 SLM, about 8 SLM to about 20 SLM, about 8 SLM to about 18 SLM, about 8 SLM to about 15 SLM, about 8 SLM to about 12 SLM, or about 8 SLM to about 10 SLM.

In some examples, during the PE-CVD process, the oxide deposition gas is exposed to a plasma having an RF power of about 800 W, about 1,000 W, about 1,500 W, about 1,800 W, or about 2,000 W to about 2,200 W, about 2,500 W, about 2,800 W, about 3,000 W, about 3,500 W, about 4,000 W, about 4,500 W, about 5,000 W, or greater. For example, during the PE-CVD process, the oxide deposition gas is exposed to a plasma having an RF power from about 800 W to 5,000 W, about 1,000 W to about 4,000 W, about 1,000 W to about 3,500 W, about 1,000 W to about 3,000 W, about 1,000 W to about 2,500 W, about 1,000 W to about 2,000 W, about 2,000 W to about 4,000 W, about 2,000 W to about 3,500 W, about 2,000 W to about 3,000 W, about 2,000 W to about 2,500 W, about 2,000 W to about 2,200 W, or about 2,800 W to about 3,200 W.

FIG. 1 is a schematic view of a thin film transistor (TFT) structure 100 containing a passivation film stack 156 that includes a silicon oxide layer 160 and a nitrogen-rich silicon nitride layer 170, according to one or more embodiments described and discussed herein. The TFT structure 100 contains a buffer layer 110 disposed on a substrate 102 and a first metal layer 120 disposed on the buffer layer 110. The buffer layer 110 is disposed between the substrate 102 and the first metal layer 120.

The substrate 102 can be a semiconductor substrate, a display substrate, or any other type of substrate. In some example, the substrate 102 can be transparent. The substrate 102 can be or include glass, quartz, sapphire, plastic or polymeric (e.g., clear plastic film), silicon, silicon oxide, gallium, gallium arsenide, doped variants thereof, or any combination thereof. The buffer layer 110 can be or include silicon oxide, silicon nitride, silicon oxynitride, dopants thereof, or any combination thereof. The buffer layer 110 can include one, two, three, four, or more layers of the same and/or different materials. In some examples, the buffer layer 110 can be or include silicon oxide and silicon nitride stacks. For example, the buffer layer 110 can include a first silicon oxide layer, a first silicon nitride layer on the a first silicon oxide layer, a second silicon oxide layer on the first silicon nitride layer. The buffer layer 110 can have a thickness of about 50 Å, about 100 Å, about 250 Å, about 500 Å, about 800 Å, about 1,000 Å, about 1,500 Å, or about 2,000 Å to about 2,500 Å, about 3,000 Å, about 4,000 Å, about 5,000 Å, about 8,000 Å, or about 10,000 Å. For example, the buffer layer 110 can have a thickness of about 50 Å to about 10,000 Å, about 500 Å to about 10,000 Å, or about 1,000 Å to about 8,000 Å.

The first metal layer 120 can be or include chromium, molybdenum, copper, titanium, tantalum, aluminum, chromium-molybdenum, copper-molybdenum, alloys thereof, dopants thereof, or any combination thereof. The first metal layer 120 can have a thickness of about 500 Å, about 800 Å, about 1,000 Å, about 1,500 Å, or about 2,000 Å to about 2,500 Å, about 3,000 Å, about 4,000 Å, about 5,000 Å, about 8,000 Å, or about 10,000 Å. For example, the first metal layer 120 can have a thickness of about 500 Å to about 10,000 Å, about 1,000 Å to about 10,000 Å, or about 1,500 Å to about 8,000 Å.

The TFT structure 100 contains a gate insulator layer 130 disposed on and/or over the first metal layer 120 and disposed on the buffer layer 110. A metal oxide layer 140 is disposed on the gate insulator layer 130. A second or contact metal layer 150 is disposed on and/or over the metal oxide layer 140 and disposed on the gate insulator layer 130 forming a gate structure.

The gate insulator layer 130 can be or include silicon oxide, silicon nitride, silicon oxynitride, aluminum oxide, hafnium oxide, zirconium oxide, titanium oxide, tantalum oxide, silicates thereof, nitrides thereof, dopants thereof, or any combination thereof. The gate insulator layer 130 can have a thickness of about 50 Å, about 100 Å, about 250 Å, about 500 Å, about 800 Å, about 1,000 Å, about 1,500 Å, or about 2,000 Å to about 2,500 Å, about 3,000 Å, about 4,000 Å, about 5,000 Å, about 8,000 Å, or about 10,000 Å. For example, the gate insulator layer 130 can have a thickness of about 50 Å to about 10,000 Å, about 500 Å to about 10,000 Å, or about 1,000 Å to about 8,000 Å.

The metal oxide layer 140 can be or include molybdenum oxide, copper oxide, aluminum oxide, titanium oxide, indium oxide, tin oxide, indium tin oxide (ITO), indium zinc oxide (IZO), indium tin zinc oxide (ITZO), alloys thereof, dopants thereof, or any combination thereof. The metal oxide layer 140 can have a thickness of about 50 Å, about 100 Å, about 250 Å, or about 500 Å to about 800 Å, about 1,000 Å, about 1,200 Å, about 1,500 Å, about 1,800 Å, or about 2,000 Å. For example, the metal oxide layer 140 can have a thickness of about 50 Å to about 2,000 Å, about 100 Å to about 2,000 Å, or about 500 Å to about 1,500 Å.

The second or contact metal layer 150 can be or include chromium, molybdenum, copper, titanium, tantalum, aluminum, chromium-molybdenum, copper-molybdenum, alloys thereof, dopants thereof, or any combination thereof. The second or contact metal layer 150 can have a thickness of about 50 Å, about 100 Å, about 250 Å, about 500 Å, about 800 Å, about 1,000 Å, about 1,500 Å, or about 2,000 Å to about 2,500 Å, about 3,000 Å, about 4,000 Å, about 5,000 Å, about 8,000 Å, or about 10,000 Å. For example, the second or contact metal layer 150 can have a thickness of about 50 Å to about 10,000 Å, about 500 Å to about 10,000 Å, or about 1,000 Å to about 8,000 Å.

The passivation film stack 156 is disposed on and over the gate structure, such that the silicon oxide layer 160 is disposed on at least one, two, or more of the contact metal layer 150, the metal oxide layer 140, the gate insulator layer 130, or any combination thereof. In one or more examples, the silicon oxide layer 160 is disposed on the contact metal layer 150, the metal oxide layer 140, and the gate insulator layer 130. The nitrogen-rich silicon nitride layer 170 is disposed on the silicon oxide layer 160.

The silicon oxide layer 160 can be or include silicon dioxide or silica. The silicon oxide layer 160 can have a thickness of about 50 nm, about 100 nm, or about 200 nm to about 300 nm, about 500 nm, about 800 nm, about 1,000 nm, or thicker. For example, the silicon oxide layer 160 can have a thickness of about 50 nm to about 1,000 nm, about 50 nm to about 800 nm, about 50 nm to about 500 nm, about 50 nm to about 300 nm, about 50 nm to about 200 nm, about 50 nm to about 100 nm, about 100 nm to about 1,000 nm, about 100 nm to about 800 nm, about 100 nm to about 500 nm, about 100 nm to about 300 nm, or about 100 nm to about 200 nm.

The nitrogen-rich silicon nitride layer 170 contains compositions as described and discussed herein. The nitrogen-rich silicon nitride layer 170 can have a thickness of about 1 nm, about 5 nm, about 10 nm, about 20 nm, about 30 nm, about 50 nm, about 80 nm, or about 100 nm to about 120 nm, about 150 nm, about 200 nm, about 250 nm, about 300 nm, about 400 nm, about 500 nm, about 800 nm, about 1,000 nm, or thicker. For example, the nitrogen-rich silicon nitride layer 170 can have a thickness of about 1 nm to about 1,000 nm, about 1 nm to about 800 nm, about 1 nm to about 500 nm, about 1 nm to about 300 nm, about 1 nm to about 250 nm, about 1 nm to about 200 nm, about 1 nm to about 150 nm, about 1 nm to about 100 nm, about 1 nm to about 80 nm, about 1 nm to about 50 nm, about 1 nm to about 25 nm, about 1 nm to about 15 nm, about 1 nm to about 10 nm, about 1 nm to about 5 nm, about 20 nm to about 1,000 nm, about 20 nm to about 800 nm, about 20 nm to about 500 nm, about 20 nm to about 300 nm, about 20 nm to about 250 nm, about 20 nm to about 200 nm, about 20 nm to about 150 nm, about 20 nm to about 100 nm, about 20 nm to about 80 nm, about 20 nm to about 50 nm, about 20 nm to about 25 nm, about 50 nm to about 1,000 nm, about 50 nm to about 800 nm, about 50 nm to about 500 nm, about 50 nm to about 300 nm, about 50 nm to about 250 nm, about 50 nm to about 200 nm, about 50 nm to about 150 nm, about 50 nm to about 100 nm, or about 50 nm to about 80 nm.

In one or more examples, the silicon oxide layer 160 has a thickness of about 50 nm to about 500 nm and the nitrogen-rich silicon nitride layer 170 has a thickness of about 1 nm to about 200 nm.

Figure 2:
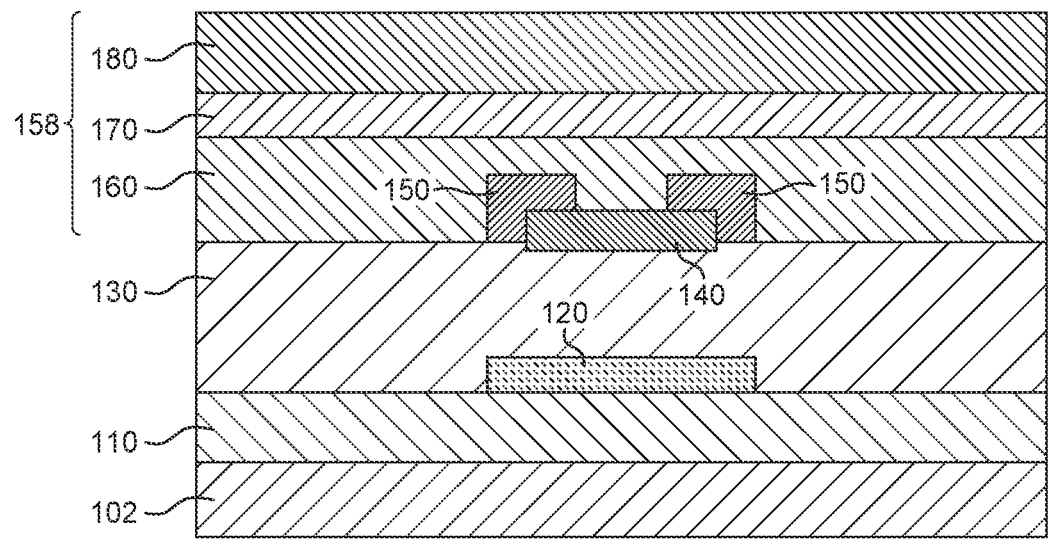
FIG. 2 is a schematic view of another TFT structure containing a nitrogen-rich silicon nitride layer, according to one or more embodiments described and discussed herein.

FIG. 2 is a schematic view of a TFT structure 200 according to one or more embodiments described and discussed herein. The TFT structure 200 contains a passivation film stack 158 which includes the silicon oxide layer 160, the nitrogen-rich silicon nitride layer 170, and a third layer 180 containing silicon nitride disposed on the nitrogen-rich silicon nitride layer 170. The third layer 180 can be or include any type of silicon nitride, such as nitrogen-rich silicon nitride, nitrogen-poor silicon nitride, and/or hydrogen-rich silicon nitride. The silicon and nitrogen in the third layer 180 can have stoichiometry or Si:N ratio of about 1:1, about 1:1.1, about 1:1.2, about 1:1.3, or about 3:4. In some examples, the third layer 180 is or contains a hydrogen-rich silicon nitride layer which has a greater hydrogen concentration than the nitrogen-rich silicon nitride layer 170. In other examples, the third layer 180 is or contains a nitrogen-rich silicon nitride layer which has the same or substantially the same nitrogen concentration as the nitrogen-rich silicon nitride layer 170.

The third layer 180 containing silicon nitride can be deposited by any deposition process, such as one or more thermal and/or plasma vapor deposition processes. Exemplary deposition processes can be or include chemical vapor deposition (CVD), plasma-enhanced CVD (PE-CVD), sputtering or physical vapor deposition (PVD), or any combination thereof. In some examples, the third layer 180 containing silicon nitride is deposited by a plasma system, such as a capacitive coupling plasma (CCP) system or an inductive coupling plasma (ICP) system with high density plasma (HDP).

The third layer 180 containing silicon nitride contains compositions as described and discussed herein. The nitrogen-rich silicon nitride layer 170 can have a thickness of about 1 nm, about 5 nm, about 10 nm, about 20 nm, about 30 nm, about 50 nm, about 80 nm, or about 100 nm to about 120 nm, about 150 nm, about 200 nm, about 250 nm, about 300 nm, about 400 nm, about 500 nm, about 800 nm, about 1,000 nm, or thicker. For example, the third layer 180 containing silicon nitride can have a thickness of about 1 nm to about 1,000 nm, about 5 nm to about 1,000 nm, about 5 nm to about 800 nm, about 5 nm to about 500 nm, about 5 nm to about 300 nm, about 5 nm to about 250 nm, about 5 nm to about 200 nm, about 5 nm to about 150 nm, about 5 nm to about 100 nm, about 5 nm to about 80 nm, about 5 nm to about 50 nm, about 5 nm to about 25 nm, about 5 nm to about 15 nm, about 5 nm to about 10 nm, about 20 nm to about 1,000 nm, about 20 nm to about 800 nm, about 20 nm to about 500 nm, about 20 nm to about 300 nm, about 20 nm to about 250 nm, about 20 nm to about 200 nm, about 20 nm to about 150 nm, about 20 nm to about 100 nm, about 20 nm to about 80 nm, about 20 nm to about 50 nm, about 20 nm to about 25 nm, about 50 nm to about 1,000 nm, about 50 nm to about 800 nm, about 50 nm to about 500 nm, about 50 nm to about 300 nm, about 50 nm to about 250 nm, about 50 nm to about 200 nm, about 50 nm to about 150 nm, or about 50 nm to about 100 nm.

In one or more examples, the silicon oxide layer 160 has a thickness of about 50 nm to about 500 nm, the nitrogen-rich silicon nitride layer 170 has a thickness of about 1 nm to about 200 nm, and the third layer 180 containing silicon nitride has a thickness of about 5 nm to about 500 nm.

Figure 3:
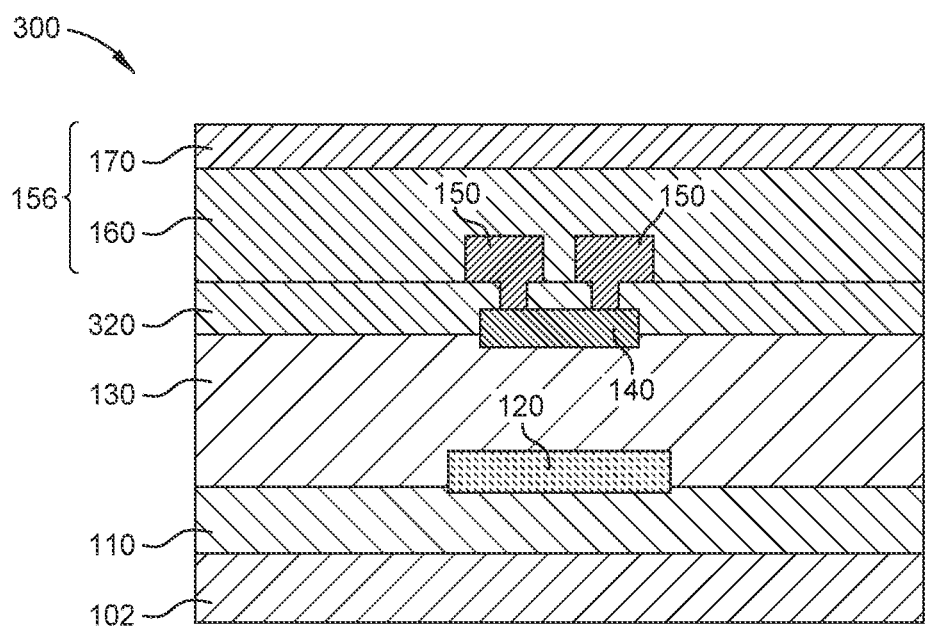
FIG. 3 is a schematic view of another TFT structure containing a nitrogen-rich silicon nitride layer, according to one or more embodiments described and discussed herein.

FIG. 3 is a schematic view of a TFT structure 300 according to one or more embodiments described and discussed herein. The TFT structure 300 contains the buffer layer 110 disposed on the substrate 102, the first metal layer 120 disposed on the buffer layer 110, and the gate insulator layer 130 disposed on the first metal layer 120 and the buffer layer 110.

The TFT assembly 300 further contains the metal oxide layer 140 disposed on the gate insulator layer 130, and an etch stop layer (ESL) 320 disposed on and over the metal oxide layer 140 and disposed on the gate insulator layer 130. The TFT assembly 300 also contains a second or contact metal layer 150 disposed on the etch stop layer 320 and the metal oxide layer 140. The second or contact metal layer 150 passes or extends through the etch stop layer 320 and by vias or contact passage ways makes contact to the metal oxide layer 140.

The etch stop layer 320 can be or include silicon oxide, aluminum oxide, hafnium oxide, zirconium oxide, titanium oxide, tantalum oxide, silicates thereof, nitrides thereof, dopants thereof, or any combination thereof. The etch stop layer 320 can have a thickness of about 50 Å, about 100 Å, about 250 Å, about 500 Å, about 800 Å, about 1,000 Å, or about 1,500 Å to about 2,000 Å, about 2,500 Å, about 3,000 Å, about 3,500 Å, about 4,000 Å, or about 5,000 Å. For example, the etch stop layer 320 can have a thickness of about 50 Å to about 5,000 Å, about 100 Å to about 5,000 Å, or about 1,000 Å to about 5,000 Å.

The silicon oxide layer 160 is disposed on and/or over at least one of the second or contact metal layer 150, the etch stop layer 320, or both. For example, the silicon oxide layer 160 of the passivation film stack 156 is disposed on and over the second or contact metal layer 150 and disposed on the etch stop layer 320. The nitrogen-rich silicon nitride layer 170 is disposed on the silicon oxide layer 160.

Figure 4:
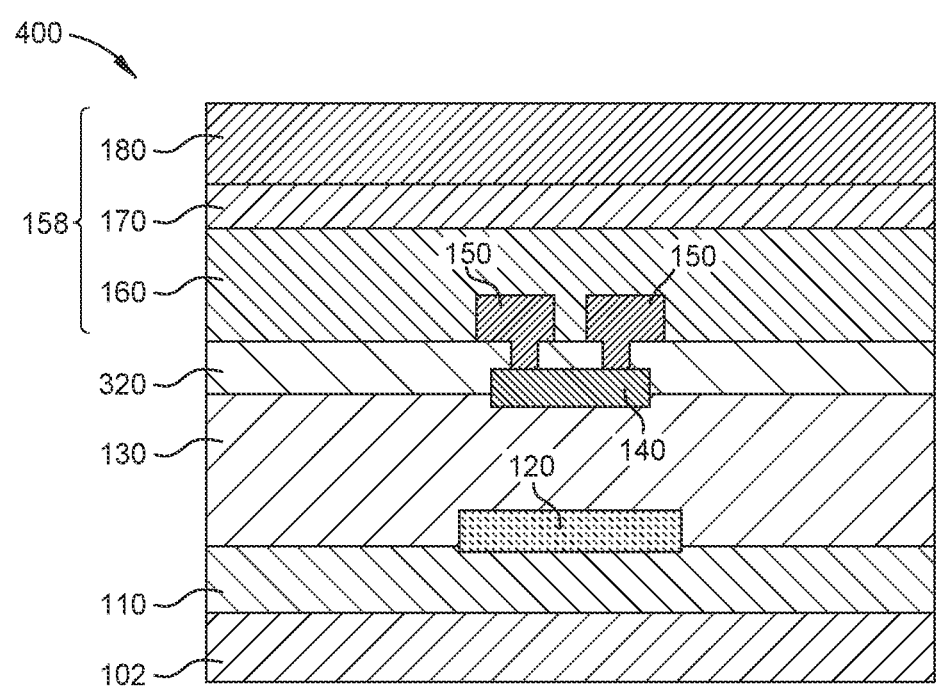
FIG. 4 is a schematic view of another TFT structure containing a nitrogen-rich silicon nitride layer, according to one or more embodiments described and discussed herein.

FIG. 4 a schematic view of a TFT structure 400 according to one or more embodiments described and discussed herein. The TFT 400 contains the passivation film stack 158 which includes the silicon oxide layer 160, the nitrogen-rich silicon nitride layer 170, and a third layer 180 containing silicon nitride disposed on the nitrogen-rich silicon nitride layer 170.

Figure 5:
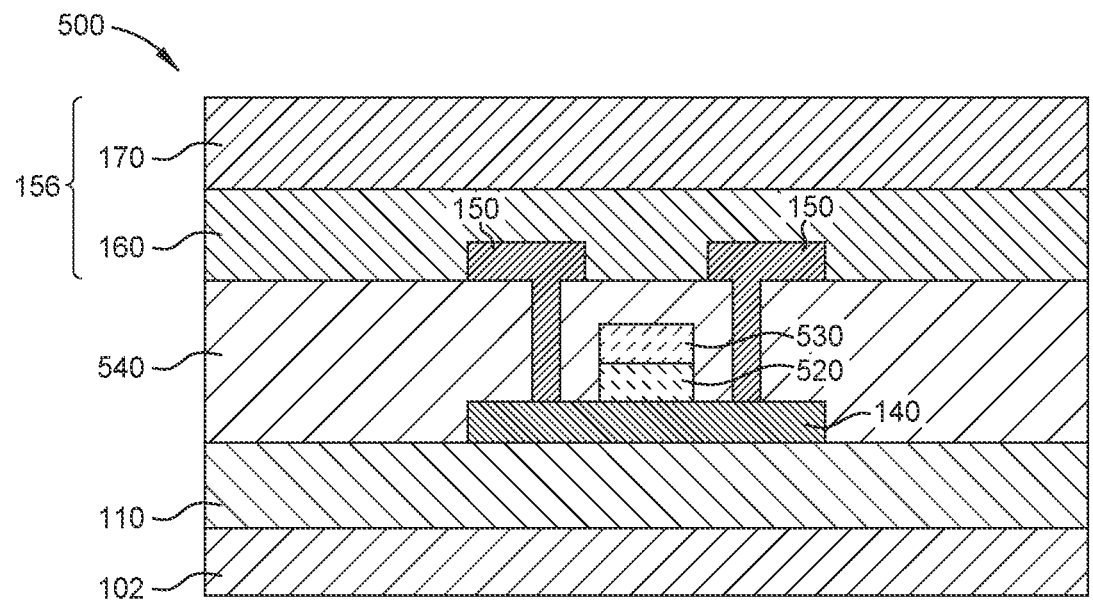
FIG. 5 is a schematic view of another TFT structure containing a nitrogen-rich silicon nitride layer, according to one or more embodiments described and discussed herein.

FIG. 5 a schematic view of a TFT structure 500 according to one or more embodiments described and discussed herein. The TFT 500 system contains the buffer layer 110 disposed on the substrate 102, the metal oxide layer 140 disposed on the buffer layer 110, a gate insulator layer 520 disposed on the metal oxide layer 140, and a first or gate metal layer 530 disposed on the gate insulator layer 520. The gate insulator layer 520 is disposed between the metal oxide layer 140 and the first or gate metal layer 530.

The gate insulator layer 520 can be or include silicon oxide, aluminum oxide, hafnium oxide, zirconium oxide, titanium oxide, tantalum oxide, silicates thereof, nitrides thereof, dopants thereof, or any combination thereof. The gate insulator layer 520 can have a thickness of about 50 Å, about 100 Å, about 250 Å, about 500 Å, about 800 Å, about 1,000 Å, or about 1,500 Å to about 2,000 Å, about 2,500 Å, about 3,000 Å, about 3,500 Å, about 4,000 Å, or about 5,000 Å. For example, the gate insulator layer 520 can have a thickness of about 50 Å to about 5,000 Å, about 100 Å to about 5,000 Å, or about 1,000 Å to about 5,000 Å.

The first or gate metal layer 530 can be or include chromium, molybdenum, copper, titanium, tantalum, aluminum, chromium-molybdenum, copper-molybdenum, alloys thereof, dopants thereof, or any combination thereof. The first or gate metal layer 530 can have a thickness of about 50 Å, about 100 Å, about 250 Å, about 500 Å, about 800 Å, about 1,000 Å, about 1,500 Å, or about 2,000 Å to about 2,500 Å, about 3,000 Å, about 4,000 Å, about 5,000 Å, about 8,000 Å, or about 10,000 Å. For example, the first or gate metal layer 530 can have a thickness of about 50 Å to about 10,000 Å, about 500 Å to about 10,000 Å, or about 1,000 Å to about 8,000 Å.

The TFT 500 also contains an interlayer dielectric (ILD) layer 540 disposed on and/or over at least one of the buffer layer 110, the metal oxide layer 140, the gate insulator layer 520, and/or the gate metal layer 530. In one or more examples, the interlayer dielectric layer 540 disposed on at least one of the buffer layer 110, and is disposed on and over the metal oxide layer 140, the gate insulator layer 520, and the gate metal layer 530.

The interlayer dielectric layer 540 can be or include one, two, or more layers of silicon oxide, silicon nitride, silicon oxynitride, aluminum oxide, hafnium oxide, zirconium oxide, titanium oxide, tantalum oxide, silicates thereof, nitrides thereof, dopants thereof, or any combination thereof. In one or more examples, the interlayer dielectric layer 540 can include a bilayer of silicon nitride disposed on silicon oxide. In other examples, the interlayer dielectric layer 540 can include a bilayer of silicon oxide disposed on silicon nitride. The interlayer dielectric layer 540 can have a thickness of about 50 Å, about 100 Å, about 250 Å, about 500 Å, about 800 Å, about 1,000 Å, about 1,500 Å, or about 2,000 Å to about 2,500 Å, about 3,000 Å, about 4,000 Å, about 5,000 Å, about 8,000 Å, or about 10,000 Å. For example, the interlayer dielectric layer 540 can have a thickness of about 50 Å to about 10,000 Å, about 500 Å to about 10,000 Å, or about 1,000 Å to about 8,000 Å.

The second or contact metal layer 150 disposed on the ILD layer 540 and the metal oxide layer 140. The second or contact metal layer 150 passes or extends through the interlayer dielectric layer 540 and by vias or contact passage ways makes contact to the metal oxide layer 140.

The silicon oxide layer 160 of the passivation film stack 156 is disposed on at least one of the ILD layer 540, the contact metal layer 150, or both. For example, the silicon oxide layer 160 is disposed on and over the ILD layer 540 and the contact metal layer 150. The nitrogen-rich silicon nitride layer 170 is disposed on the silicon oxide layer 160.

Figure 6:
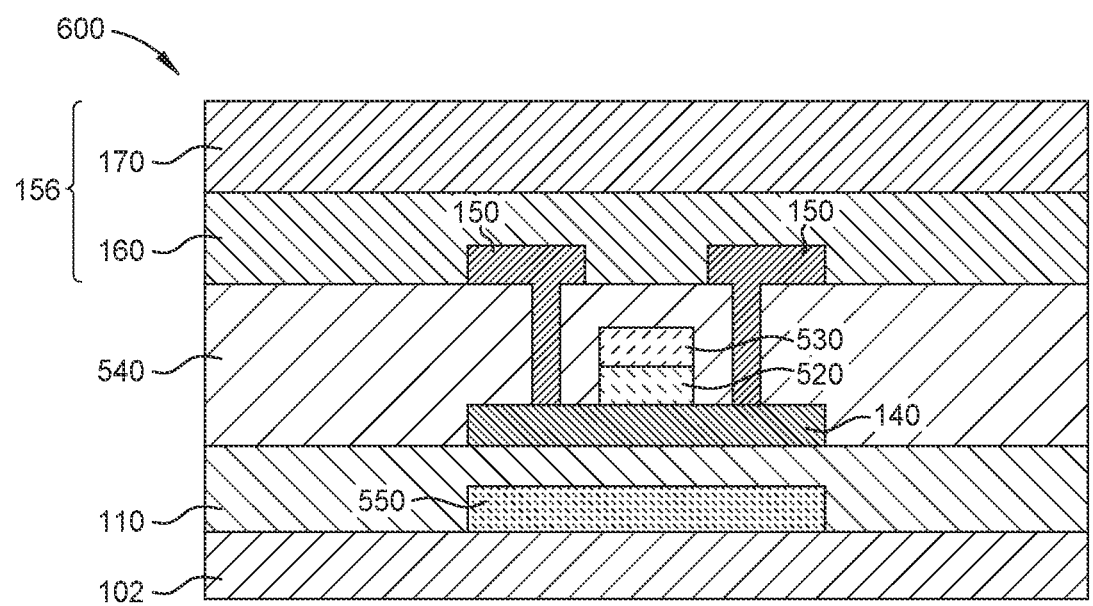
FIG. 6 is a schematic view of another TFT structure containing a nitrogen-rich silicon nitride layer, according to one or more embodiments described and discussed herein.

FIG. 6 a schematic view of a TFT structure 600 according to one or more embodiments described and discussed herein. The TFT system 600 has all of layers or components as the TFT system 500, but also includes a third metal layer 550 disposed on the substrate 102. The buffer layer 110 is disposed on and/or over the third metal layer 550 and disposed on the substrate 102.

The third metal layer 550 can be or include chromium, molybdenum, copper, titanium, tantalum, aluminum, chromium-molybdenum, copper-molybdenum, alloys thereof, dopants thereof, or any combination thereof. The third metal layer 550 can have a thickness of about 50 Å, about 100 Å, about 250 Å, about 500 Å, about 800 Å, about 1,000 Å, or about 1,500 Å to about 2,000 Å, about 2,500 Å, about 3,000 Å, about 3,500 Å, about 4,000 Å, or about 5,000 Å. For example, the third metal layer 550 can have a thickness of about 50 Å to about 5,000 Å, about 100 Å to about 5,000 Å, or about 1,000 Å to about 5,000 Å.

Figure 7:
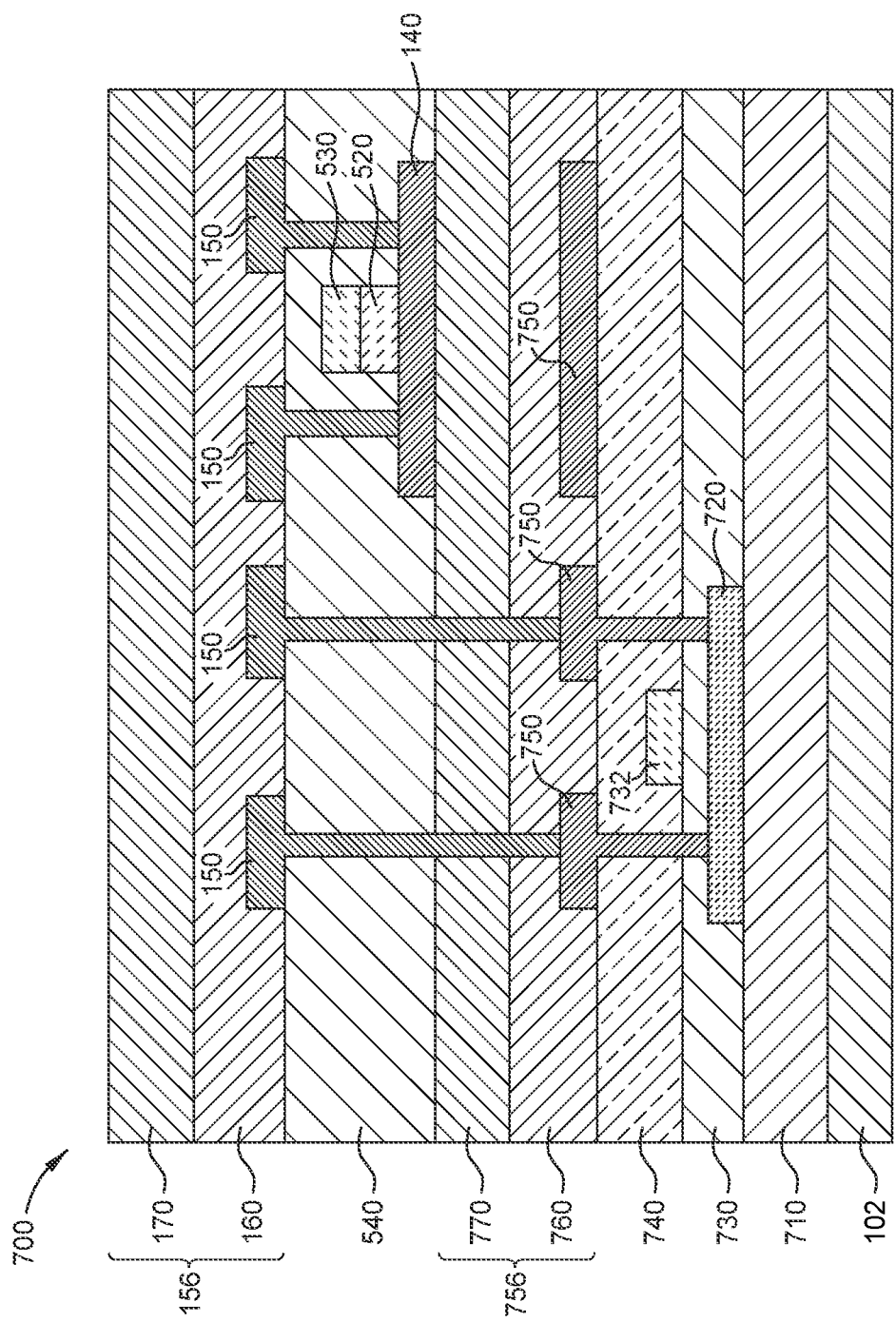
FIG. 7 is a schematic view of a TFT structure containing two nitrogen-rich silicon nitride layers, according to one or more embodiments described and discussed herein.
Figure 8:
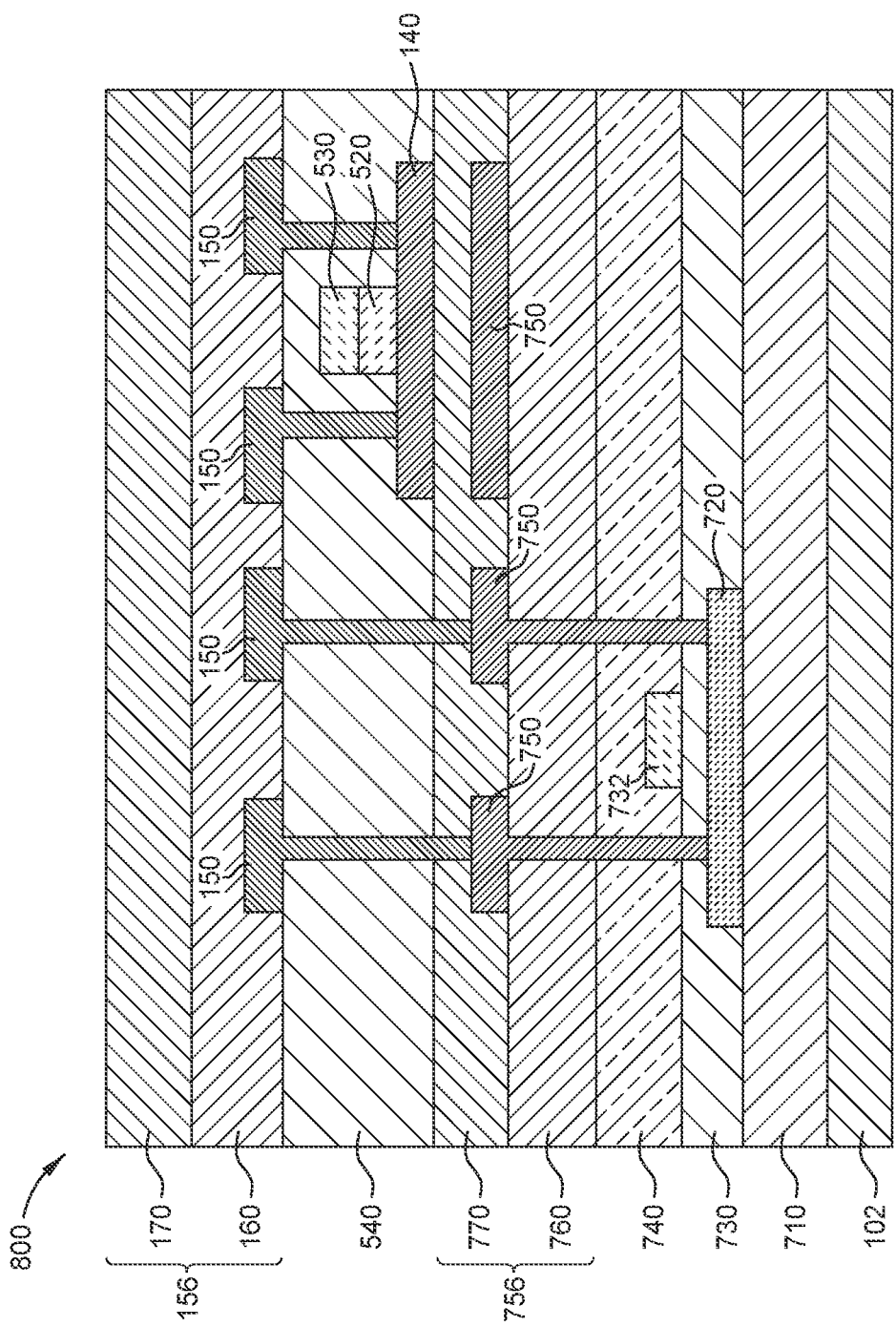
FIG. 8 is a schematic view of another TFT structure containing two nitrogen-rich silicon nitride layers, according to one or more embodiments described and discussed herein.

FIG. 7 is a schematic view of TFT 700, according to one or more embodiments described and discussed herein. FIG. 8 is a schematic view of TFT 800, according to embodiments described and discussed herein. Each of the TFT 700, 800 contain at least two nitrogen-rich silicon nitride layers, such as the nitrogen-rich silicon nitride layer 170 and a first oxide buffer layer 760 containing the nitrogen-rich silicon nitride material.

The TFTs 700, 800 contain the buffer layer 710 disposed on the substrate 102, where the buffer layer 710 contains one or more low-temperature polysilicon (LTPS) materials. The LTPS material can be or include one or more polysilicon materials, amorphous silicon (α-Si) materials, micro-crystalline silicon materials, dopants thereof, or any combination thereof. The buffer layer 710 can have a thickness of about 50 Å, about 100 Å, about 250 Å, about 500 Å, about 800 Å, about 1,000 Å, about 1,500 Å, or about 2,000 Å to about 2,500 Å, about 3,000 Å, about 4,000 Å, about 5,000 Å, about 8,000 Å, or about 10,000 Å. For example, the buffer layer 710 can have a thickness of about 50 Å to about 10,000 Å, about 500 Å to about 10,000 Å, or about 1,000 Å to about 8,000 Å.

The TFTs 700, 800 contain a polysilicon layer 720 disposed on the buffer layer 710, a first gate insulator layer 730 disposed on the polysilicon layer 720 and the buffer layer 710, a first metal layer 732 disposed on the first gate insulator layer 730, and a first interlayer dielectric (ILD) layer 740 disposed on at least one of the first metal layer 732 and the first gate insulator layer 730. The polysilicon layer 720 can be or include one or more polysilicon materials, amorphous silicon (a-Si) materials, micro-crystalline silicon materials, dopants thereof, or any combination thereof. The polysilicon layer 720 can have a thickness of about 50 Å, about 100 Å, about 250 Å, or about 500 Å to about 600 Å, about 800 Å, about 1,000 Å, about 1,500 Å, about 1,800 Å, or about 2,000 Å. For example, the polysilicon layer 720 can have a thickness of about 50 Å to about 2,000 Å, about 100 Å to about 2,000 Å, or about 500 Å to about 1,500 Å.

The first gate insulator layer 730 can be or include silicon oxide, aluminum oxide, hafnium oxide, zirconium oxide, titanium oxide, tantalum oxide, silicates thereof, nitrides thereof, dopants thereof, or any combination thereof. The first gate insulator layer 730 can have a thickness of about 50 Å, about 100 Å, about 250 Å, about 500 Å, about 800 Å, about 1,000 Å, or about 1,500 Å to about 2,000 Å, about 2,500 Å, about 3,000 Å, about 3,500 Å, about 4,000 Å, or about 5,000 Å. For example, the first gate insulator layer 730 can have a thickness of about 50 Å to about 5,000 Å, about 100 Å to about 5,000 Å, or about 1,000 Å to about 5,000 Å.

The first metal layer 732 can be or include chromium, molybdenum, copper, titanium, tantalum, aluminum, chromium-molybdenum, copper-molybdenum, alloys thereof, dopants thereof, or any combination thereof. The first metal layer 732 can have a thickness of about 100 Å, about 150 Å, about 200 Å, about 250 Å, about 500 Å, about 800 Å, about 1,000 Å, about 1,500 Å, or about 2,000 Å to about 2,500 Å, about 3,000 Å, about 4,000 Å, about 5,000 Å, about 8,000 Å, or about 10,000 Å. For example, the first metal layer 732 can have a thickness of about 100 Å to about 10,000 Å, about 500 Å to about 10,000 Å, or about 1,000 Å to about 8,000 Å.

The first ILD layer 740 can be or include one, two, or more layers of silicon oxide, silicon nitride, silicon oxynitride, aluminum oxide, hafnium oxide, zirconium oxide, titanium oxide, tantalum oxide, silicates thereof, nitrides thereof, dopants thereof, or any combination thereof. In one or more examples, the interlayer dielectric layer 740 can include a bilayer of silicon nitride disposed on silicon oxide. In other examples, the first ILD layer 740 can include a bilayer of silicon oxide disposed on silicon nitride. The first ILD layer 740 can have a thickness of about 50 Å, about 100 Å, about 250 Å, about 500 Å, about 800 Å, about 1,000 Å, about 1,500 Å, about 2,000 Å to about 2,500 Å, about 3,000 Å, about 4,000 Å, about 5,000 Å, about 8,000 Å, or about 10,000 Å. For example, the first ILD layer 740 can have a thickness of about 50 Å to about 10,000 Å, about 500 Å to about 10,000 Å, or about 1,000 Å to about 8,000 Å.

In one or more embodiments, the TFTs 700, 800 contain an oxide buffer film 756 which contains one or more first oxide buffer layers 760 and one or more second oxide buffer layers 770. The first oxide buffer layer 760 contains the nitrogen-rich silicon nitride material and is disposed on the first ILD layer 740. The second oxide buffer layer 770 contains a silicon oxide material and is disposed on the first oxide buffer layer 760.

The first oxide buffer layer 760 containing the nitrogen-rich silicon nitride material has a thickness of about 1 nm, about 5 nm, about 10 nm, about 20 nm, about 30 nm, about 50 nm, about 80 nm, or about 100 nm to about 120 nm, about 150 nm, about 200 nm, about 250 nm, about 300 nm, about 400 nm, about 500 nm, about 800 nm, about 1,000 nm, or thicker. For example, the first oxide buffer layer 760 containing the nitrogen-rich silicon nitride material can have a thickness of about 1 nm to about 1,000 nm, about 5 nm to about 1,000 nm, about 5 nm to about 800 nm, about 5 nm to about 500 nm, about 5 nm to about 300 nm, about 5 nm to about 250 nm, about 5 nm to about 200 nm, about 5 nm to about 150 nm, about 5 nm to about 100 nm, about 5 nm to about 80 nm, about 5 nm to about 50 nm, about 5 nm to about 25 nm, about 5 nm to about 15 nm, about 5 nm to about 10 nm, about 20 nm to about 1,000 nm, about 20 nm to about 800 nm, about 20 nm to about 500 nm, about 20 nm to about 300 nm, about 20 nm to about 250 nm, about 20 nm to about 200 nm, about 20 nm to about 150 nm, about 20 nm to about 100 nm, about 20 nm to about 80 nm, about 20 nm to about 50 nm, about 20 nm to about 25 nm, about 50 nm to about 1,000 nm, about 50 nm to about 800 nm, about 50 nm to about 500 nm, about 50 nm to about 300 nm, about 50 nm to about 250 nm, about 50 nm to about 200 nm, about 50 nm to about 150 nm, or about 50 nm to about 100 nm.

The second oxide buffer layer 770 containing a silicon oxide material has a thickness of about 1 nm, about 5 nm, about 10 nm, about 20 nm, about 30 nm, about 50 nm, about 80 nm, or about 100 nm to about 120 nm, about 150 nm, about 200 nm, about 250 nm, about 300 nm, about 400 nm, about 500 nm, about 800 nm, about 1,000 nm, or thicker. For example, the second oxide buffer layer 770 containing a silicon oxide material can have a thickness of about 1 nm to about 1,000 nm, about 5 nm to about 1,000 nm, about 5 nm to about 800 nm, about 5 nm to about 500 nm, about 5 nm to about 300 nm, about 5 nm to about 250 nm, about 5 nm to about 200 nm, about 5 nm to about 150 nm, about 5 nm to about 100 nm, about 5 nm to about 80 nm, about 5 nm to about 50 nm, about 5 nm to about 25 nm, about 5 nm to about 15 nm, about 5 nm to about 10 nm, about 20 nm to about 1,000 nm, about 20 nm to about 800 nm, about 20 nm to about 500 nm, about 20 nm to about 300 nm, about 20 nm to about 250 nm, about 20 nm to about 200 nm, about 20 nm to about 150 nm, about 20 nm to about 100 nm, about 20 nm to about 80 nm, about 20 nm to about 50 nm, about 20 nm to about 25 nm, about 50 nm to about 1,000 nm, about 50 nm to about 800 nm, about 50 nm to about 500 nm, about 50 nm to about 300 nm, about 50 nm to about 250 nm, about 50 nm to about 200 nm, about 50 nm to about 150 nm, or about 50 nm to about 100 nm.

In one or more examples, the first oxide buffer layer 760 containing the nitrogen-rich silicon nitride material has a thickness of about 50 nm to about 500 nm, and the second oxide buffer layer 770 containing a silicon oxide material has a thickness of about 5 nm to about 500 nm.

A second metal layer 750 is in contact with the first oxide buffer layer 760 and the polysilicon layer 720 in both of the TFTs 700, 800. In one or more embodiments of the TFT 700, the second metal layer 750 is further in contact with the first ILD layer 740, as depicted in FIG. 7. For example, the second metal layer 750 is disposed on the first ILD layer 740, and the first oxide buffer layer 760 containing nitrogen-rich silicon nitride material is disposed on and/or over the second metal layer 750. In one or more embodiments of the TFT 800, the second metal layer 750 is further in contact with the second oxide buffer layer 770, as depicted in FIG. 8. For example, the second metal layer 750 is disposed on the first oxide buffer layer 760 containing nitrogen-rich silicon nitride material, and the second oxide buffer layer 770 is disposed on and/or over the second metal layer 750.

The TFTs 700, 800 also contain the metal oxide layer 140 disposed on the second oxide buffer layer 770, the second gate insulator layer 520 disposed on the metal oxide layer 140, and a third metal gate layer such as the gate metal layer 530 disposed on the second gate insulator layer 520. The TFTs 700, 800 further contain a second ILD layer such as the ILD layer 540 disposed on at least one of the second oxide buffer layer 770, the metal oxide layer 140, the second gate insulator layer 520, and the gate metal layer 530.

As further depicted in FIGS. 7 and 8, the TFTs 700, 800 contain a fourth contact metal layer such as the contact metal layer 150 disposed on the second ILD layer 540 and in contact with the metal oxide layer 140, the second metal layer 750, or both. The silicon oxide layer 160 of the passivation film stack 156 is disposed on at least one of the second ILD layer 540 and on and/or over the contact metal layer 150. The nitrogen-rich silicon nitride layer 170 is disposed on the silicon oxide layer 160.

While the foregoing is directed to embodiments of the disclosure, other and further embodiments may be devised without departing from the basic scope thereof, and the scope thereof is determined by the claims that follow. All documents described herein are incorporated by reference herein, including any priority documents and/or testing procedures to the extent they are not inconsistent with this text. As is apparent from the foregoing general description and the specific embodiments, while forms of the present disclosure have been illustrated and described, various modifications can be made without departing from the spirit and scope of the present disclosure. Accordingly, it is not intended that the present disclosure be limited thereby. Likewise, the term "comprising" is considered synonymous with the term "including" for purposes of United States law. Likewise, whenever a composition, an element, or a group of elements is preceded with the transitional phrase "comprising", it is understood that the same composition or group of elements with transitional phrases "consisting essentially of", "consisting of", "selected from the group of consisting of", or "is" preceding the recitation of the composition, element, or elements and vice versa, are contemplated.

Certain embodiments and features have been described using a set of numerical upper limits and a set of numerical lower limits. It should be appreciated that ranges including the combination of any two values, e.g., the combination of any lower value with any upper value, the combination of any two lower values, and/or the combination of any two upper values are contemplated unless otherwise indicated. Certain lower limits, upper limits and ranges appear in one or more claims below.

What is claimed is:

1. A passivation film stack, comprising:
   a silicon oxide layer disposed on a workpiece;
   a nitrogen-rich silicon nitride layer disposed on the silicon oxide layer; and
   a hydrogen-rich silicon nitride layer disposed on the nitrogen-rich silicon nitride layer, wherein the hydrogen-rich silicon nitride layer has a greater hydrogen concentration than the nitrogen-rich silicon nitride layer.

2. The passivation film stack of claim 1, wherein the nitrogen-rich silicon nitride layer has a silicon-hydrogen bond concentration of about 0.1% to about 17% and a total hydrogen bond concentration of less than 30%.

3. The passivation film stack of claim 1, wherein the nitrogen-rich silicon nitride layer has a silicon concentration of about 20 at % to about 35 at %, a nitrogen concentration of about 40 at % to about 75 at %, and a hydrogen concentration of about 10 at % to about 35 at %, and wherein the nitrogen-rich silicon nitride layer has a nitrogen to silicon ratio of greater than 1.03 to about 2.

4. The passivation film stack of claim 1, wherein the nitrogen-rich silicon nitride layer has a silicon concentration of about 27 at % to about 34 at %, a nitrogen concentration of about 42 at % to about 65 at %, and a hydrogen concentration of about 18 at % to about 25 at %, and wherein the nitrogen-rich silicon nitride layer has a nitrogen to silicon ratio of greater than 1.03 to about 2.

5. The passivation film stack of claim 1, wherein the nitrogen-rich silicon nitride layer has a water resistivity of about $1\times10^{-8}$ g/m$^2$/day to about $1\times10^{-4}$ g/m$^2$/day.

6. The passivation film stack of claim 1, wherein the nitrogen-rich silicon nitride layer has a thickness of about 1 nm to about 500 nm.

7. The passivation film stack of claim 1, wherein the nitrogen-rich silicon nitride layer is deposited by a plasma-enhanced chemical vapor deposition process from a deposition gas comprising a silicon precursor, a nitrogen precursor, and a carrier gas.

8. The passivation film stack of claim 7, wherein a molar ratio of the silicon precursor to the nitrogen precursor to the carrier gas within the deposition gas is about 1:a range from about 4 to about 8:a range from about 20 to about 80, respectively.

9. The passivation film stack of claim 8, wherein the molar ratio of the silicon precursor to the nitrogen precursor to the carrier gas within the deposition gas is about 1:a range from about 5 to about 7:a range from about 30 to about 50, respectively, and wherein the silicon precursor comprises silane, the nitrogen precursor comprises ammonia, and the carrier gas comprises nitrogen (N$_2$).

10. A passivation film stack, comprising:
    a silicon oxide layer disposed on a workpiece; and
    a nitrogen-rich silicon nitride layer disposed on the silicon oxide layer,
    wherein the nitrogen-rich silicon nitride layer has a water resistivity of about $1\times10^{-8}$ g/m$^2$/day to about $1\times10^{-4}$ g/m$^2$/day, and wherein the nitrogen-rich silicon nitride layer has a total hydrogen bond concentration of less than 30%.

11. The passivation film stack of claim 10, wherein the nitrogen-rich silicon nitride layer has a silicon concentration of about 20 at % to about 35 at %, a nitrogen concentration of about 40 at % to about 75 at %, and a hydrogen concentration of about 10 at % to about 35 at %, and wherein the nitrogen-rich silicon nitride layer has a nitrogen to silicon ratio of greater than 1.03 to about 2.

12. The passivation film stack of claim 10, wherein the nitrogen-rich silicon nitride layer has a silicon concentration of about 27 at % to about 34 at %, a nitrogen concentration of about 42 at % to about 65 at %, and a hydrogen concentration of about 18 at % to about 25 at %, and wherein the nitrogen-rich silicon nitride layer has a nitrogen to silicon ratio of greater than 1.03 to about 2.

13. The passivation film stack of claim 10, wherein the nitrogen-rich silicon nitride layer has a silicon-hydrogen bond concentration of about 0.1% to about 10%.

14. The passivation film stack of claim 13, wherein the silicon-hydrogen bond concentration of the nitrogen-rich silicon nitride layer is about 0.5% to about 6%.

15. The passivation film stack of claim 10, wherein the nitrogen-rich silicon nitride layer has a total hydrogen bond concentration of less than 30%.

16. The passivation film stack of claim 10, wherein the nitrogen-rich silicon nitride layer has a thickness of about 1 nm to about 500 nm.

17. The passivation film stack of claim 10, wherein the silicon oxide layer has a thickness of about 50 nm to about 1,000 nm.

18. The passivation film stack of claim 10, further comprising a hydrogen-rich silicon nitride layer disposed on the nitrogen-rich silicon nitride layer.

19. The passivation film stack of claim 17, wherein the hydrogen-rich silicon nitride layer has a greater hydrogen concentration than the nitrogen-rich silicon nitride layer.

20. A passivation film stack, comprising:
    a silicon oxide layer disposed on a workpiece;
    a nitrogen-rich silicon nitride layer disposed on the silicon oxide layer, wherein the nitrogen-rich silicon nitride layer has a total hydrogen bond concentration of less than 30%; and
    a hydrogen-rich silicon nitride layer disposed on the nitrogen-rich silicon nitride layer, wherein the hydrogen-rich silicon nitride layer has a greater hydrogen concentration than the nitrogen-rich silicon nitride layer.

* * * * *